United States Patent
Choi et al.

(10) Patent No.: US 7,218,048 B2
(45) Date of Patent: May 15, 2007

(54) DISPLAY APPARATUS HAVING PHOTO SENSOR

(75) Inventors: Joon-Hoo Choi, Seoul (KR); In-Su Joo, Seongnam-si (KR); Kyu-Ha Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 321 days.

(21) Appl. No.: 10/771,341

(22) Filed: Feb. 5, 2004

(65) Prior Publication Data

US 2005/0082968 A1     Apr. 21, 2005

(30) Foreign Application Priority Data

Oct. 15, 2003    (KR) ...................... 10-2003-0071871

(51) Int. Cl.
*H05B 33/00*    (2006.01)
(52) U.S. Cl. .................. 313/504; 313/506; 345/48; 345/77; 345/84; 345/207
(58) Field of Classification Search ................ 313/506, 313/504; 345/48, 77, 84, 90, 98, 100, 207, 345/204
See application file for complete search history.

(56) References Cited

U.S. PATENT DOCUMENTS

| | | | |
|---|---|---|---|
| 6,995,753 B2 * | 2/2006 | Yamazaki et al. | 345/204 |
| 7,061,480 B2 * | 6/2006 | Anderson et al. | 345/207 |
| 7,068,246 B2 * | 6/2006 | Yamazaki et al. | 345/76 |

* cited by examiner

*Primary Examiner*—Ashok Patel
(74) *Attorney, Agent, or Firm*—Cantor Colburn LLP (57) ABSTRACT

An electronic display apparatus includes a substrate, pixels and light sensing parts. The substrate includes a display region and a peripheral region adjacent the display region, and the substrate includes a plurality of gate lines extended in a first direction and a plurality of data lines extended in a second direction that is substantially perpendicular to the first direction. The pixels defined by each of the data and gate lines are formed in the display region to display an image. The light sensing part is formed in the peripheral region, and the light sensing part senses an intensity of an ambient light. The light sensing part that senses an intensity of an ambient light is formed on the array substrate, so that a luminance of the display apparatus may be adjusted in accordance with the intensity of the ambient light.

29 Claims, 8 Drawing Sheets

DISPLAY APPARATUS HAVING PHOTO SENSOR

CROSS-REFERENCE TO RELATED APPLICATIONS

This application relies for priority upon Korean Patent Application No. 2003-71871 filed on Oct. 15, 2003, the contents of which are herein incorporated by reference in its entirety.

BACKGROUND OF THE INVENTION

1. Field of the Invention

The present invention relates to a display apparatus, and more particularly to a display apparatus having photo sensor formed on a substrate on which pixel arrays are formed.

2. Description of the Related Art

In the information society at the present time, electronic display apparatuses are more important as information transmission media and various electronic display apparatuses are widely applied for industrial apparatus or home appliances. Such electronic display apparatuses continue to advance to have new appropriate functions for various demands of the information society.

In general, electronic display apparatuses display and transmit various pieces of information to users who utilize such information. That is, the electronic display apparatuses convert electronic information signals outputted from an electronic apparatus into light information signals recognized by users' vision.

The electronic display apparatuses are generally divided into emissive display apparatuses and non-emissive display apparatuses. The emissive display apparatuses display light information signals through emitting lights, and the non-emissive display apparatus displays the light information signals through reflection, a scattering or an interference. The emissive display apparatuses include a cathode ray tube (CRT), a plasma display panel apparatus (PDP), a light emitting diode (LED) and an electroluminescent display apparatus (ELD). The emissive display apparatuses are called as active display apparatuses. Also, the non-emissive display apparatuses, called as passive display apparatuses, include a liquid crystal display apparatus (LCD), an electrochemical display apparatus (ECD) and an electrophoretic image display apparatus (EPID).

As a technology of semiconductor has been developed, the demand for new electronic display apparatuses has been greatly increased, such as a flat panel display apparatus which has excellent characteristics, for example, a thin thickness, a light weight, a low driving voltage and a low power consumption. The flat panel display apparatuses can be manufactured using the rapidly improving semiconductor technology.

In the flat panel apparatuses, liquid crystal display apparatuses (LCD) have been widely utilized for various electronic apparatuses because the liquid crystal display apparatuses are thin, and have low power dissipation and high display qualities approximately identical to those of the cathode ray tube. Also, the liquid crystal display apparatus can operate under a low driving voltage and can be easily manufactured.

The liquid crystal display apparatuses are generally includes a transmissive type, a reflection type and transmissive and reflective type liquid crystal display apparatuses. The transmissive type liquid crystal display apparatus displays information by using an ambient light source. The reflection type liquid crystal display apparatus displays information by using ambient light. The transmissive and reflective type liquid crystal display apparatus displays information by using ambient light source in a dark place, and displays information by using ambient light in a bright place.

The electroluminescent display apparatus includes an organic electrodluminescent display apparatus and an inorganic electroluminescent display apparatus. The organic electroluminescent display apparatus has merits such as low power consumption, wide viewing angle, high-speed response, high contrast ratio, etc., so that researches on the organic electroluminescent display apparatus have been performed.

In the organic electroluminescent display apparatus, a cathode provides a light emitting part with electrons, and an anode provides the light emitting part with holes, so that the electrons combine with the holes to form excitons. The exitons drop to a ground state, so that a light is generated.

The organic electroluminescent display apparatus includes a passive matrix type display apparatus and active matrix type display apparatus. The active matrix type organic electroluminescent display apparatus has a plurality of organic electroluminescent devices. The organic electroluminescent devices corresponding to pixels are driven independently to display an image.

However, the organic electroluminescent display apparatus is one of the emissive display apparatuses, so that the organic electroluminescent display apparatus may not be formed in a reflective type. Thus, when an environmental light is bright, a visibility is deteriorated.

Further, the transmissive and reflective type liquid crystal display apparatus has a limit to display a high quality image because the transmissive and reflective type liquid crystal display apparatus may not determine an intensity of the environmental light by itself.

SUMMARY OF THE INVENTION

The present invention provides an electronic display apparatus that adjusts a luminance of display panel in accordance with a luminance of an ambient light.

The present invention also provides an organic electroluminescent display apparatus that adjusts a luminance of the electroluminescent display apparatus in accordance with a luminance of an ambient light.

The present invention also provides a liquid crystal display apparatus that adjusts a luminance of a backlight assembly in accordance with a luminance of an ambient light.

In an exemplary electronic display apparatus of the present invention, the electronic display apparatus includes a substrate, a plurality of pixels and at least one of light sensing parts. The substrate includes a display region and a peripheral region that is adjacent the display region, and the substrate includes a plurality of gate lines extended in a first direction and a plurality of data lines extended in a second direction that is substantially perpendicular to the first direction. The pixels are formed in the display region to display an image, and the pixels are defined by each of the data lines and each of the gate lines. The light sensing part is formed in the peripheral region, and the light sensing part senses an intensity of an ambient light.

In an exemplary organic electroluminescent display apparatus of the present invention, the organic electroluminescent display apparatus includes a substrate, a plurality of pixels and at least one of light sensing parts. The substrate includes a display region and a peripheral region that is adjacent the display region. The pixels includes a gate line extended in a first direction, a data line extended in a second direction that is substantially perpendicular to the first direction, a switching device that is electronically connected to the gate and data lines, a first electrode that is electronically connected to the switching device, a electroluminescent layer disposed over the first electrode, and a second electrode formed on the electroluminescent layer. The light sensing parts are formed in the peripheral region, the light sensing part sensing an intensity of an ambient light.

In an exemplary liquid crystal display apparatus of the present invention, the liquid crystal display apparatus includes a display assembly and a backlight assembly. The display assembly includes a substrate, a plurality of pixels, and at least one of light sensing parts. The substrate includes a display region and a peripheral region that is adjacent the display region. The pixels include a gate line extended in a first direction, a data line extended in a second direction that is substantially perpendicular to the first direction, a switching device that is electronically connected to the gate and data lines, and a transparent electrode that is electronically connected to the switching device. The light sensing parts are formed in the peripheral region, and the light sensing part senses an intensity of an ambient light. The backlight assembly provides the display assembly with a light. An intensity of the light provided from the backlight assembly is adjusted according to the intensity of the ambient light sensed by the light sensing part.

According to present invention, the light sensing part that senses an intensity of an ambient light is formed on the array substrate, so that a luminance of the display apparatus may be adjusted in accordance with the intensity of the ambient light.

BRIEF DESCRIPTION OF THE DRAWINGS

The above and other features and advantage points of the present invention will become more apparent by describing in detailed exemplary embodiments thereof with reference to the accompanying drawings, in which.

DESCRIPTION OF THE PREFERRED EMBODIMENTS

Hereinafter, the preferred embodiments of the present invention will be described in detail with reference to the accompanied drawings.

EMBODIMENT 1

Figure 1:
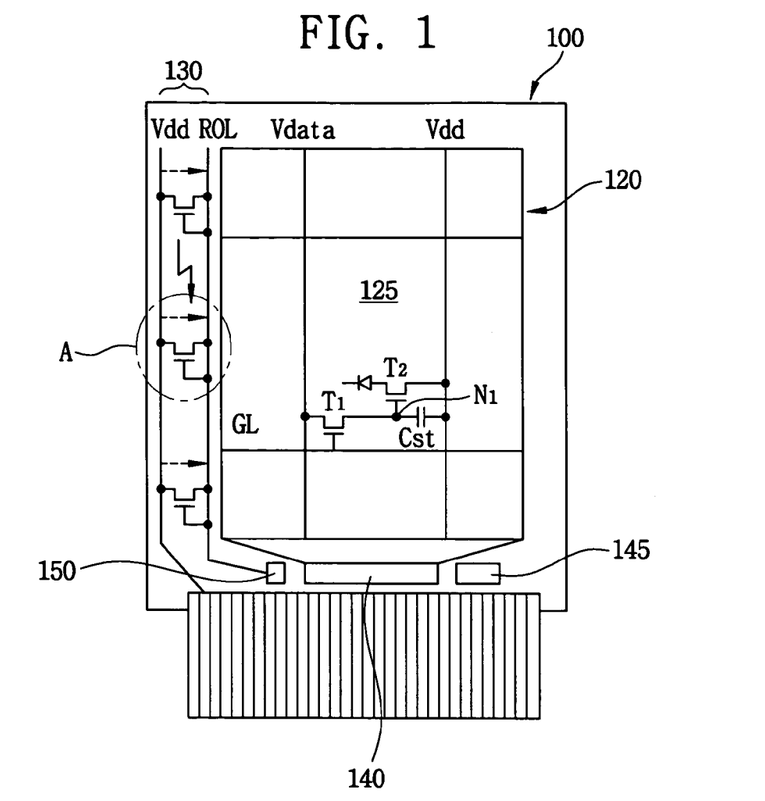
FIG. 1 is a schematic view showing a top emission type AMOELD apparatus according to a first exemplary embodiment of the present invention.
Figure 2:
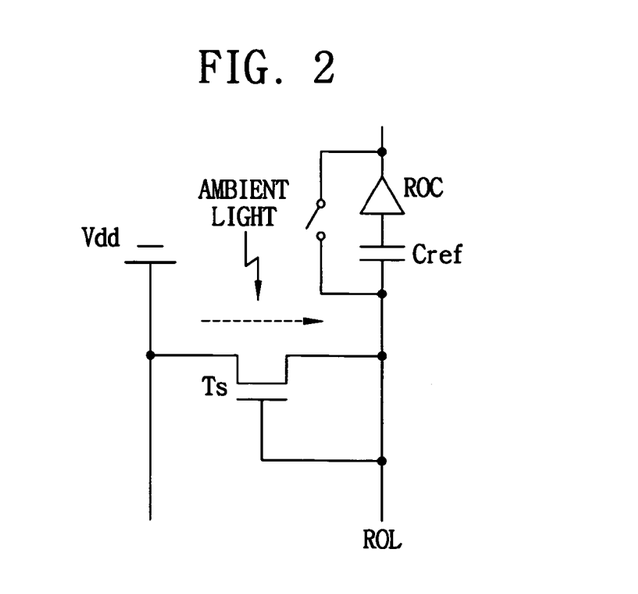
FIG. 2 is an enlarged view showing a portion 'A' of FIG. 1.
Figure 3A:
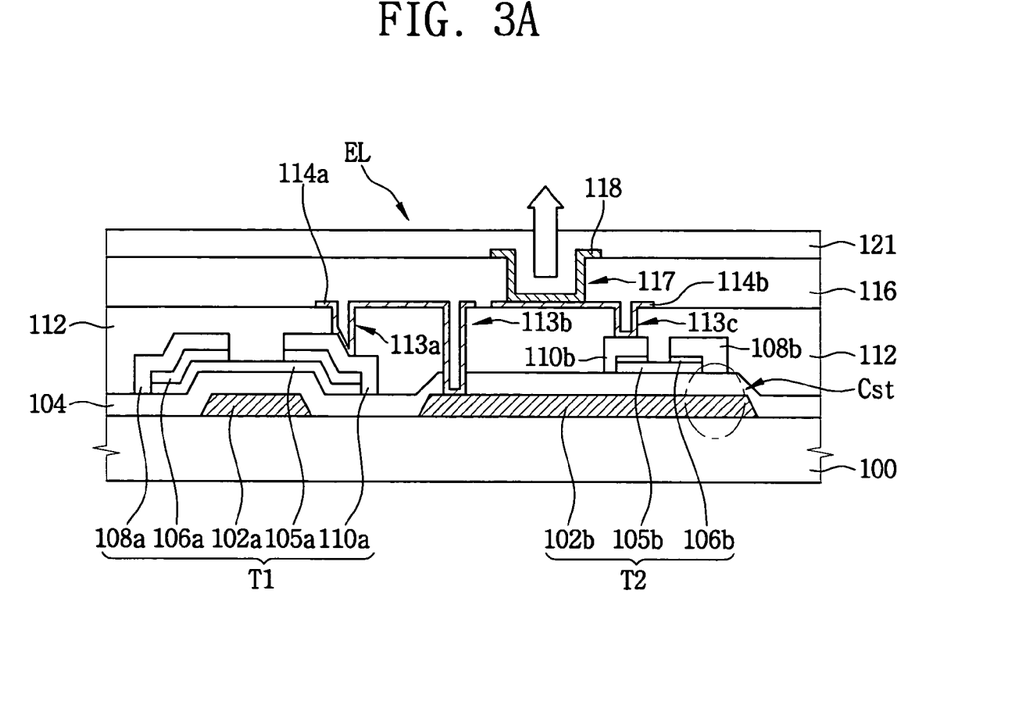
FIGS. 3A and 3B are cross-sectional views showing a pixel part and a light sensing part of the top emission type AMOELD of FIG. 1, respectively.
Figure 3B:
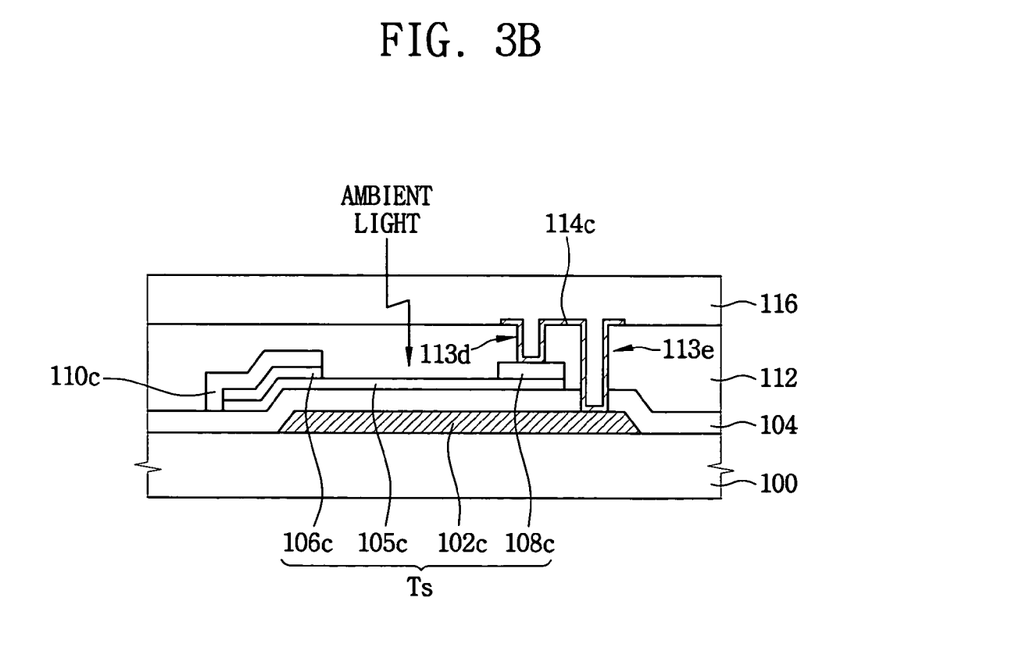

FIG. 1 is a schematic view showing a top emission type AMOELD apparatus according to a first exemplary embodiment of the present invention. FIG. 2 is an enlarged view showing a portion 'A' of FIG. 1. FIGS. 3A and 3B are cross-sectional views showing a pixel part and a light sensing part of the top emission type AMOELD of FIG. 1, respectively.

Referring to FIGS. 1, 2, 3A and 3B, a top emission type active matrix organic electroluminescence display apparatus (hereinafter, referred to as AMOELD) according to a first exemplary embodiment of the present invention includes an array substrate 100 having a plurality of pixels to display an image. The pixels are arranged in a matrix shape.

The array substrate includes a plurality of gate lines GL and a plurality of data lines Vdata. The gate lines GL and the data line Vdata are extended in a substantially perpendicular direction with each other to form a unit pixel 125 defined by the gate lines GL and the data lines Vdata.

A power supply line Vdd is interposed between the neighboring data lines Vdata, such that the power supply line Vdd is substantially perpendicular to the data lines Vdata. A maximum direct current of a display signal is applied to the power supply line Vdd.

The gate line GL and the data line Vdata are electronically connected to a first thin film transistor T1. The first thin film transistor T1 operates as a switching device.

In detail, the first thin film transistor $T_1$ includes a gate electrode 102a that is electronically connected to the gate line GL, a source electrode 108a that is electronically connected to the data line Vdata, and a drain electrode 110a that is electronically connected to a first node $N_1$. A data voltage is applied to the source electrode 108a via the data line Vdata, and the data voltage is transferred to the drain electrode 110a of the first thin film transistor $T_1$.

A gate electrode 102b of a second thin film transistor $T_2$ and a first capacitor electrode of a storage capacitor Cst are electronically connected to the first node $N_1$. A second capacitor electrode of the storage capacitor Cst and a source electrode 108b of the second thin film transistor $T_2$ are electronically connected to the power supply line Vdd.

A drain electrode 120b of the second thin film transistor T2 is electronically connected to an organic electroluminescent device EL.

Thus, when the first thin film transistor $T_1$ is turned on, the second thin film transistor $T_2$ may be turned on according to a state of the data line Vdd. Thus, a voltage of the power supply line Vdd is applied to the electroluminescent device EL to drive the electroluminescent device EL.

The first and second thin film transistors $T_1$ and $T_2$ of FIGS. 3A and 3B correspond to inverted staggered type amorphous silicon thin film transistor that has a gate electrode disposed lower than drain and source electrodes. However, various transistors may operate as the first and second thin film transistors $T_1$ and $T_2$.

The electroluminescent device EL includes an electroluminescent layer 118, and first and second electrodes 114b and 121. The first electrode 114b operates as a pixel electrode and anode electrode. The electroluminescent layer 118 is disposed on the first electrode 114b. The second electrode 121 is disposed on the electroluminescent layer 118, and the second electrode 121 operates as a cathode electrode. The first electrode 114b is optically opaque and electronically conductive. However, the second electrode 121 is optically transparent and electronically conductive to allow a light generated from the electroluminescent device EL to pass through the second electrode 121. Thus, an image is displayed.

The second electrode 121 is formed in a display region 120, and the second electrode 121 is preferably not formed in a peripheral region where a light sensing part 'A' is formed.

The light sensing part 'A' for sensing an intensity of an ambient light is formed in the peripheral region surrounding the display region 120.

Generally, a fingerprint recognizer, a touch screen panel, a light sensing circuit, etc., include cells having a storage capacitor and two thin film transistors, which are arranged in a matrix shape to recognize a position. However, the light sensing part 'A' only senses an intensity of an ambient light. Thus, the light sensing part 'A' is not required to be arranged in a matrix shape. Thus, only one light sensing part 'A' including a light sensing thin film transistor Ts may be formed in the peripheral region 130, or the light sensing part 'A' may be arranged in a line.

A readout line ROL for transferring a signal generated from the light sensing thin film transistor Ts to a readout circuit part 150 is formed in the peripheral region 120.

The light sensing part 'A' includes the light sensing thin film transistor Ts, the power supply line Vdd and the readout line ROL. The light sensing thin film transistor Ts is driven by an ambient light to generate a signal. The light sensing thin film transistor Ts includes a drain electrode that is electronically connected to the power supply line Vdd, and gate and source electrodes that are electronically connected to the readout line ROL. Thus, the signal generated form the light sensing thin film transistor Ts is transferred to the readout circuit part 150 via the readout line ROL. The readout circuit part 150 receives the signal, and transforms the signal into a digital signal.

The readout circuit part 150 for detecting the intensity of the ambient light is formed in the peripheral region 120 of the array substrate 100.

Additionally, a gate driving part 145 for driving the gate line GL, and a data driving part for driving the data line Vdata are formed in the peripheral region 120.

When an amorphous silicon transistor is used as a switching device of the AMOELD, the AMOELD is preferably formed to a top emission type. Thus, the light sensing thin film transistor is formed to be an inverted staggered type, so that a channel of the light sensing thin film transistor Ts is exposed to an ambient light.

When the ambient light arrives at the channel of the light sensing thin film transistor, a photocurrent flows through the light sensing thin film transistor Ts, and the photocurrent is applied to the readout circuit part ROC.

Figure 4:
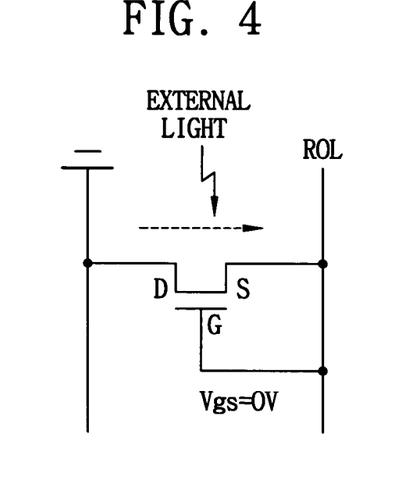
FIG. 4 is a circuit diagram showing an operation of a light sensing part of the AMOELD of FIG. 1.
Figure 5:
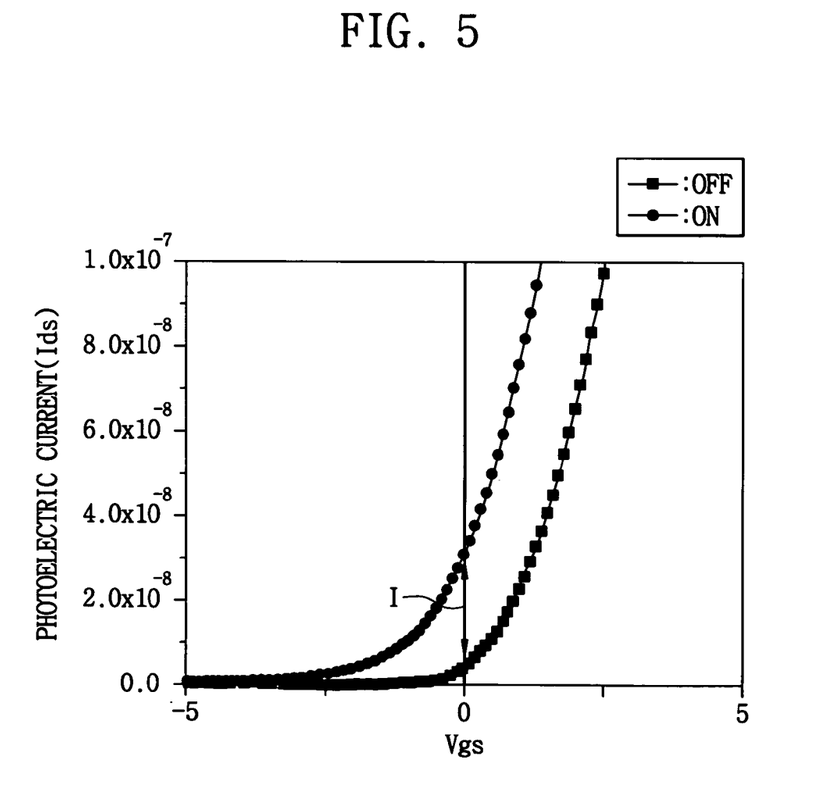
FIG. 5 is a graph showing a relation between a voltage Vgs and a photoelectronic current.

FIG. 4 is a circuit diagram showing an operation of a light sensing part of the AMOELD of FIG. 1, and FIG. 5 is a graph showing a relation between a voltage Vgs and a photoelectronic current. In the graph of FIG. 5, a symbol '■' corresponds to a photocurrent without an ambient light, and a symbol ' ' corresponds to a photocurrent with an ambient light.

Referring to FIGS. 2, 4 and 5, gate and source electrodes G and S of a light sensing thin film transistor Ts are electronically connected to each other to set Vgs to be 0V.

A voltage that is to be applied to the power supply line Vdd is adjusted so as not to be saturated to an intense ambient light. Preferably, the voltage of the power supply line is modulated in a range from about 2V to about 10V.

When the ambient light arrives at a channel of a light sensing thin film transistor Ts, a photocurrent I flows through the thin film transistor Ts. The photocurrent I flows though the readout line ROL to arrive at the readout circuit ROC.

Thus, a capacitor Cref of the readout circuit part ROC is charged, so that a voltage formed between two terminals of the capacitor Cref is changed. The changed voltage is amplified via an amplifier AMP (not shown) to be outputted to an analog-digital converter ADC (not shown).

A digital signal from the analog-digital converter ADC is fed back to a driving control part of the top emission type AMOELD, so that luminance of the top emission type is AMOELD is adjusted.

Thus, when circumferential brightness is low, a luminance of the AMOELD is adjusted to be low, and when circumferential brightness is high, a luminance of the top emission type AMOELD is adjusted to be high.

Hereinafter, a method of manufacturing an array substrate 100 of FIG. 1 will be explained referring to FIGS. 3A and 3B.

A first conductive layer is formed on an array substrate 100 including a display region 120 and a peripheral region 130. The first conductive layer is patterned to form a first conductive pattern. For example, the first conductive pattern may be patterned via photolithography method. The first conductive pattern includes a gate line GL extended in a first direction, gate electrodes 102a and 102b of first and second thin film transistors T1 and T2 diverged from the gate line GL, and a gate electrode 102c of a light sensing thin film transistor Ts. Further, the first conductive pattern includes a lower electrode of a storage capacitor Cst, which is electronically connected to the gate electrode 102b of the second thin film transistor T2.

Silicon-nitride is deposited on the first substrate that includes the first conductive pattern formed on the first substrate to form a gate insulation layer 104. The silicon-nitride may be deposited via plasma-enhanced chemical vapor deposition PECVD.

An active layer that comprises amorphous silicon, and an ohmic contact layer that comprises n+ amorphous silicon are formed in sequence. The active layer and the ohmic contact layer may be formed by in-situ process in a chamber of PECVD apparatus. Then, the active layer and the ohmic contact layer are patterned to form active patterns 105a, 105b and 105c, and ohmic contact patterns 106a, 106b and 106c.

Then, a second conductive layer is formed, and the second conductive layer is patterned to form the second conductive pattern. The second conductive layer may be patterned via photolithography method.

The second conductive pattern includes a data line Vdata, a power supply line Vdd, a readout line ROL, drain and source electrodes 108a and 108b, and 110a and 110b of the first and second thin film transistors T1 and T2, and drain and source electrodes 110c 108c of the light sensing thin film transistor Ts.

The data line Vdata is extended in a second direction that is substantially perpendicular to the first direction. The power supply line Vdd is also extended in a second direction, such that the power supply line and the data line Vdata are substantially in parallel with each other. The readout line ROL is formed in a peripheral region. The source electrodes 108a and 108b of the first and second thin film transistors T1 and T2 diverge from the data line Vdata. The drain electrode 110c of the light sensing thin film transistor Ts is diverged from the power supply line Vdd, and the source electrode 108c of the light sensing thin film transistor Ts is diverged from the readout line ROL. Further, the second conductive pattern includes an upper electrode of the storage capacitor Cst, which is electronically connected to the source electrode 108b of the second thin film transistor T2.

Then, an ohmic contact patterns 106a, 106b and 106c that are exposed between the source electrodes 108a, 108b and 108c, and the drain electrodes 110a, 110b and 110c, for example, via reactive ion etching method. Then, active pattern regions exposed between the drain electrodes 110a, 110b and 110c and the source electrodes 108a, 108b and 108c operate as a channel layer of first, second and light sensing thin film transistors T1, T2 and Ts, respectively.

When first, second and light sensing thin film transistors T1, T2 and Ts are formed, silicon nitride is deposited, so that a protection layer 112 for protecting the first, second and light sensing thin film transistors T1, T2 and Ts is formed. Then, the protection layer 112 is etched partially to form first to fifth contact holes 113a, 113b, 113c, 113d and 113e. The first contact hole 113a exposes the drain electrode 110a of the first thin film transistor T1. The second and third contact holes 113b and 113c expose gate and drain electrodes 102b and 108b of the second thin film transistor T2. The fourth and fifth contact holes 113d and 113e expose source and gate electrodes 108c and 102c of the light sensing thin film transistor Ts.

A third conductive layer is deposited on the first to fifth contact holes 113a to 113e, and the protection layer 112. The third conductive layer is opaque and conductive. The third conductive layer is patterned, for example, via photolithography method to form a third conductive pattern. The third conductive pattern may include a chromium (Cr) layer and an indium tin oxide (ITO) layer formed on the chromium layer.

The third conductive pattern includes a first electrode 114b, and first and second bridge wirings 114a and 114c. The first bridge wiring 114a electronically connects the drain electrode 110a of the first thin film transistor T1 and the gate electrode 102b of the second thin film transistor T2 via the first and second contact holes 113a and 113b. The first electrode 114b is electronically connected to drain electrode 110b of the second thin film transistor T2 via the third contact hole 113c. The second bridge wiring 114c electronically connects the source and gate electrodes 108c and 102c of the light sensing thin film transistor Ts via the fourth and fifth contact holes 113d and 113e.

The first electrode 114b corresponding to a pixel electrode operates as an anode electrode of the electroluminescent device EL.

A layer comprising organic or inorganic material with low dielectronic constant is deposited on the third conductive patterns 114a, 114b and 114c and the protection layer 112 to form the planarization layer 116. Then, the planarization layer 116 is patterned, for example, via photolithography method, to form an opening 117 that exposes a portion of the pixel electrode 114. The opening 117 has a substantially same shape as the first electrode 114b, but the width of the opening 117 is smaller than the first electrode 114b. The planarization layer 116 supports an organic electroluminescent layer 118.

The organic electroluminescent layer 116 is formed to cover the opening 117, and a second electrode 121 is formed. The second electrode 121 operates as a cathode of the organic electroluminescent device.

The second electrode 121 comprises a material that has a low work function. For example, the second electrode 121 includes Mg:Ag layer and an indium tin oxide layer formed on the Mg:Ag layer. Preferably, the second electrode 121 is formed only in the display region. That is, the second electrode 121 is not formed in the peripheral region, so that an intensity of an ambient light is more accurately detected by the light sensing part disposed in the peripheral region.

As described above, according to the present embodiment, the light sensing part that senses an intensity of an ambient light is formed on the array substrate to adjust a luminance of a display apparatus. When a circumferential luminance is low, the luminance of top emission type AMOELD is adjusted to be low. When the circumferential luminance is high, the luminance of the top emission type AMOELD is adjusted to be high. Thus, a visibility of the top emission type AMOELD is enhanced.

EMBODIMENT 2

Figure 6A:
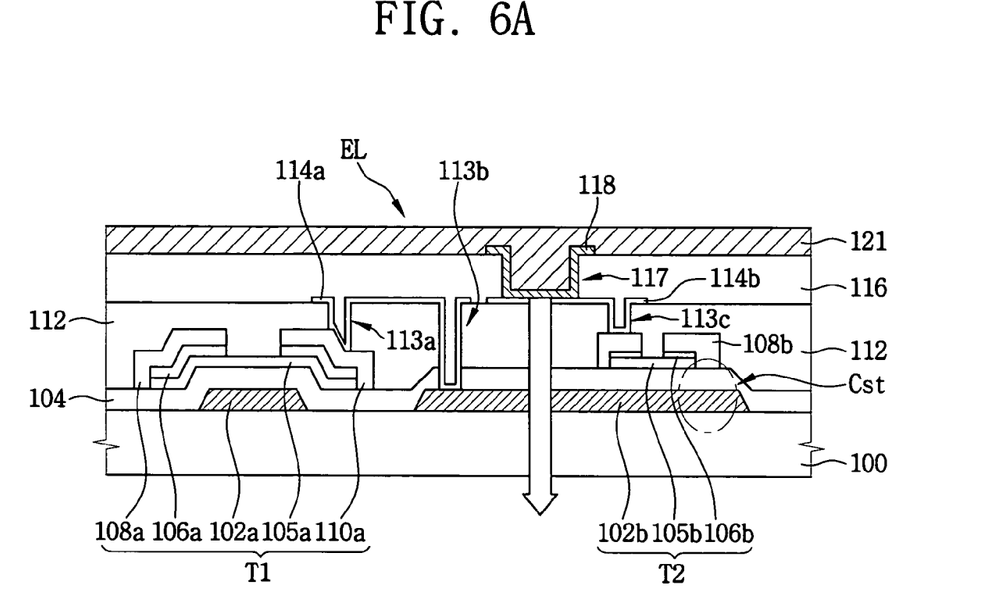
FIGS. 6A and 6B are cross-sectional views showing a pixel part and a light sensing part of a bottom emission type AMOELD according to a second exemplary embodiment of the present invention, respectively.
Figure 6B:
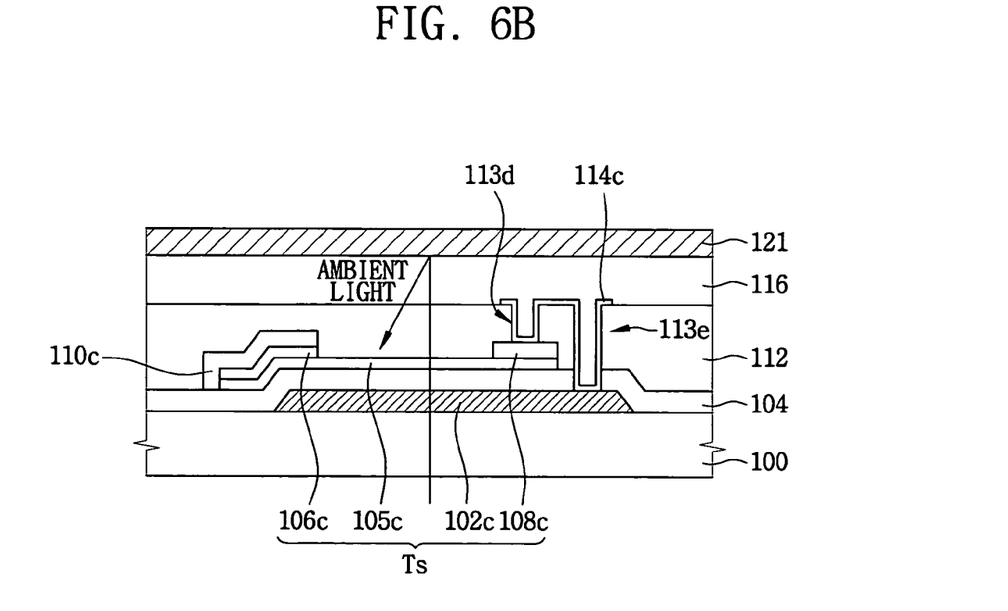

FIGS. 6A and 6B are cross-sectional views showing a pixel part and a light sensing part of an AMOELD according to a second exemplary embodiment of the present invention, respectively. The bottom type AMOELD of the present embodiment is same as in Embodiment 1 except for first and second electrodes. Thus, the same reference numerals will be used to refer to the same or like parts as those described in Embodiment 1 and any further explanation will be omitted.

Referring to FIGS. 6A and 6B, in case of a bottom emission type AMOELD, a light generated from an organic electroluminescent device EL exits the bottom type AMOELD via a substrate 100. Thus, the substrate 100 is disposed at a displaying side of the bottom type AMOELD.

Thus, the bottom type AMOELD includes a first electrode 114b that is transparent and operates as an anode electrode of an organic electroluminescent device EL, and a second electrode 121 that is opaque and operates as a cathode electrode of the organic electroluminescent device EL. For example, the first electrode 114b may comprise indium tin oxide (ITO), and the second electrode 121 may include aluminum (Al).

An ambient light enters the substrate 100, and advances continuously. When the ambient light arrives at the second electrode 121, the ambient light is reflected on the second electrode 121. Then, the ambient light reflected on the second electrode 121 arrives at a channel of a light sensing thin film transistor Ts. Then, a photocurrent flows through the light sensing thin film transistor Ts. A readout circuit part ROC senses a photocurrent magnitude.

A first thin film transistor Ti that corresponds to a switching device of the pixel includes a gate electrode 102a that is electronically connected to a gate line GL, a source electrode 108a that is electronically connected to a data line Vdata, and a drain electrode 110a that is electronically connected to a gate electrode 102b of a second thin film transistor T2 that corresponds to a switching device of the pixel via a first bridge wiring 114a.

The second thin film transistor T2 includes a source electrode 108b that is electronically connected to a power line Vdd, a drain electrode 110b that is electronically connected to the organic electroluminescent device EL, and a gate electrode 102b that is electronically connected to the drain electrode 110a of the first thin film transistor T1.

The storage capacitor Cst includes a first capacitor electrode that is electronically connected to a gate electrode 102b of the second thin film transistor T2 and a drain electrode 110a of the first thin film transistor T1, and a second capacitor electrode that is electronically connected to the power supply line Vdd.

The organic electroluminescent device EL includes a first electrode 114b that operates as a pixel electrode and an anode electrode, and a second electrode 121 that operates as a cathode electrode, and an organic electroluminescent layer 118. The first electrode 114b is optically transparent and electronically conductive. The organic electroluminescent layer 118 is formed on the first electrode 114b. The second electrode 121 formed on an organic electroluminescent layer 118 is opaque.

The second electrode 121 that reflects the ambient light toward the channel of the light sensing thin film transistor Ts is formed on entire surface of the substrate 100, so that the channel layer detects an intensity of an ambient light.

The light sensing part that is formed in the peripheral region includes the light sensing thin film transistor Ts, a power supply line Vdd and a readout line RL. The light sensing thin film transistor Ts is driven by an ambient light to output a signal. The power supply line Vdd is electronically connected to a drain electrode 110c of the light sensing thin film transistor Ts. The readout line RL is electronically connected to the source electrode 108c, so that the signal is transferred to the readout circuit part ROC that converts the signal into a digital signal.

The gate and source electrodes 102c and 108c of the light sensing thin film transistor Ts are electronically connected to each other via a second bridge wiring 114c.

As described above, the bottom emission type AMOELD may adopt the light sensing part.

EMBODIMENT 3

Figure 7:
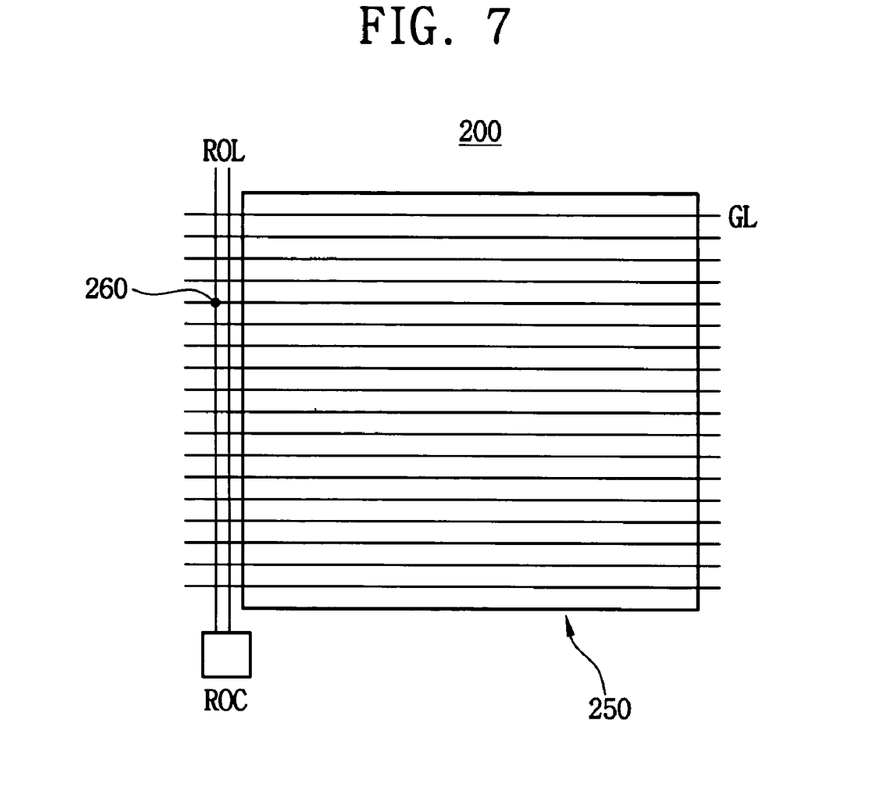
FIG. 7 is a schematic view showing a transmissive and reflective type liquid crystal display apparatus according to a third exemplary embodiment of the present invention.
Figure 8:
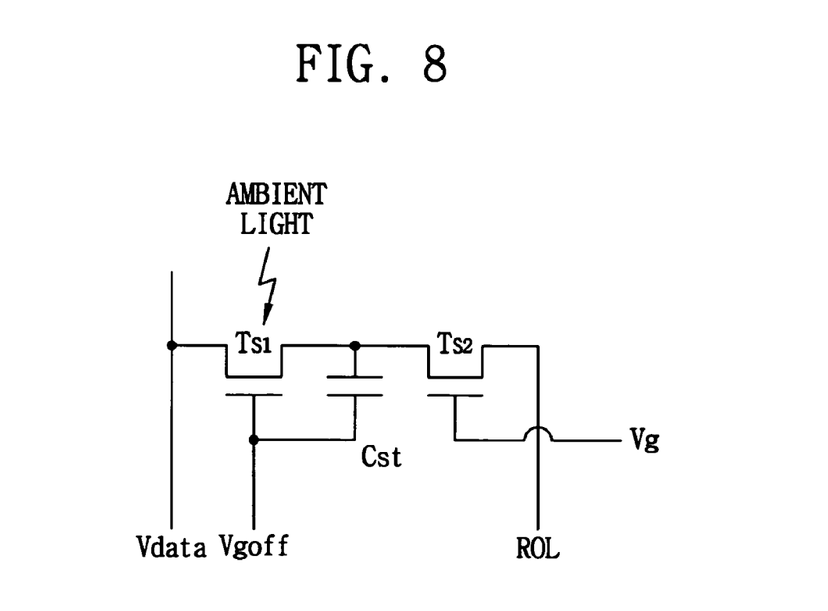
FIG. 8 is a circuit diagram showing a light sensing part of a transmissive and reflective type liquid crystal display apparatus according to a third exemplary embodiment of the present invention.
Figure 9:
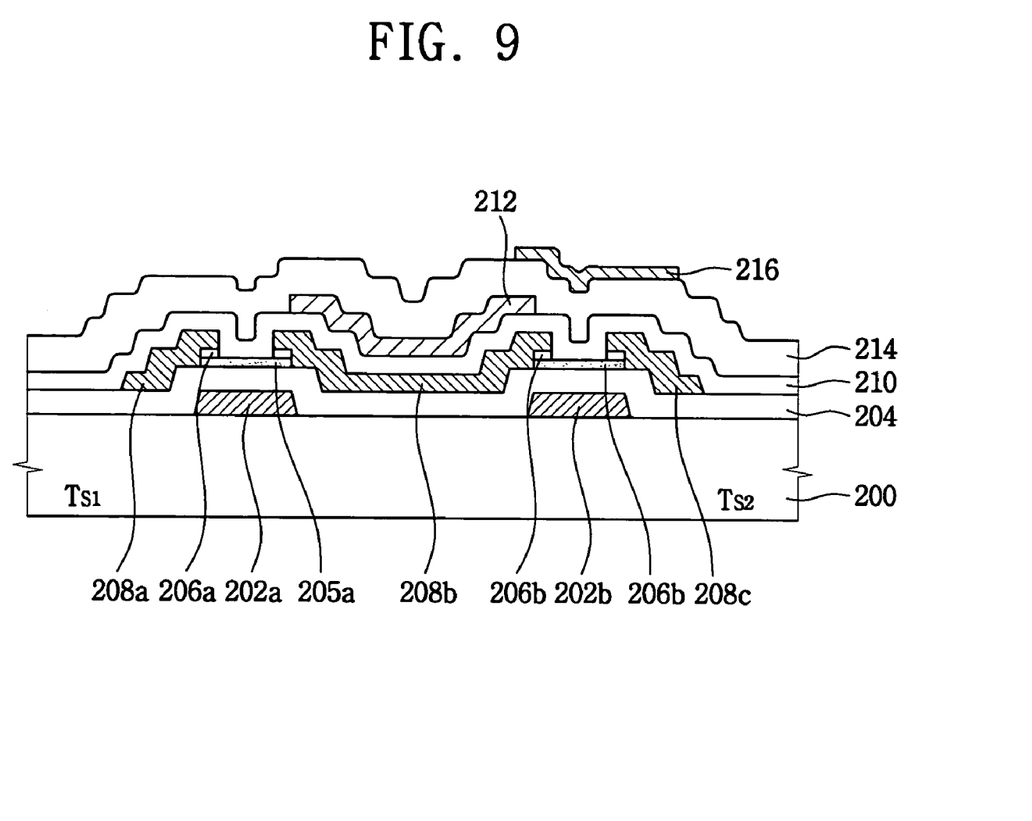
FIG. 9 is a cross-sectional view showing a light sensing part of the FIG. 8.

FIG. 7 is a schematic view showing a transmissive and reflective type liquid crystal display apparatus according to a third exemplary embodiment of the present invention, FIG. 8 is a circuit diagram showing a light sensing part of a transmissive and reflective type liquid crystal display apparatus according to a third exemplary embodiment of the present invention, and FIG. 9 is a cross-sectional view showing a light sensing part of the FIG. 8.

Referring to FIGS. 7, 8 and 9, a transmissive and reflective type liquid crystal display apparatus according to a third exemplary embodiment of the present invention includes an array substrate 200, a color filter substrate (not shown) facing the array substrate 200, and a liquid crystal layer (not shown) that is interposed between the array substrate 200 and the color filter substrate. A plurality of pixels is arranged in the array substrate 200.

A gate line GL and a data line Vdata formed in a display region of the array substrate 200 define the pixels. In detail, each of pixels includes a gate line GL, a data line Vdata, a switching device, a transparent electrode and a reflective electrode. The gate line GL is extended in a first direction. The data line Vdata is extended in a second direction that is substantially perpendicular to the first direction. The switching device is electronically connected to the data and gate lines Vdata and GL. The transparent and reflective electrodes are electronically connected to the switching device, and the transparent and reflective electrodes form a pixel electrode (not shown) including a transparent region and a reflective region.

The switching device corresponding to an inverted staggered type amorphous thin film transistor that includes a gate electrode diverged from the gate line GL, a source electrode diverged from the data line Vdata, and a drain electrode that is electronically connected the pixel electrode.

A light sensing part 260 for sensing an intensity of an ambient light is formed in a peripheral region that is adjacent to the display region. The light sensing part 260 is formed at a crossing of one of the readout lines ROL and a gate line GL.

The light sensing part 260 may be formed in a line or in a plural of lines.

The light sensing part 260 includes first and second thin film transistors Ts1 and Ts2, and a storage capacitor Cst. The first thin film transistor Ts1 senses an intensity of an ambient light and, generates a photocurrent. The storage capacitor Cst receives the photocurrent to store electronic charge. The second thin film transistor Ts2 outputs the electronic charge.

The first and second thin film transistors Ts1 and Ts2 may be inverted staggered type amorphous silicon thin film transistors.

The first thin film transistor Ts1 includes a gate electrode 202a that is electronically connected to a Voff signal line, a drain electrode 208a that is electronically connected to the data line Vdata, and a source electrode 208b that is electronically connected to a lower electrode of the storage capacitor Cst and a drain electrode of the second thin film transistor Ts2.

The second thin film transistor Ts2 includes a gate electrode 202b that is electronically connected to a Vg signal line, a source electrode 208c that is electronically connected to a readout line ROL, and a drain electrode the is electronically connected to the is source electrode 208b of the first thin film transistor Ts1.

The signal is transferred to the readout circuit part ROC via the readout line ROL. The readout circuit ROC coverts the signal into a digital signal.

A light blocking layer 216 is disposed over the second thin film transistor Ts2. Thus, an ambient light may arrive at the first thin film transistor Ts1, but the ambient light may not arrive at the second thin film transistor Ts2 due to the light blocking layer 216.

The Vg signal may be transferred via the gate line GL, or the Vg signal may be transferred via separately formed Vg signal line that is electronically connected to the gate electrode 202b of the second thin film transistor Ts2

The readout circuit part ROC that reads out an intensity of the ambient light sensed by the first thin film transistor Ts1, and electronically connected to the readout line ROL is formed in the peripheral region.

Further, gate and data driving parts (not shown) are formed also in the peripheral region.

Hereinafter, an operation of the light sensing part 260 will be explained.

When an ambient light arrives at the first thin film transistor Ts1 that senses light, a negative is applied to the Vgoff signal line that is electronically connected to the gate electrode 202a of the first thin film transistor Ts1, and a positive voltage is applied to the drain electrode 208a of the first thin film transistor Ts1 to turn off the first thin film transistor Ts1. Then, a leakage current of the first thin film transistor Ts1 that is exposed to the ambient light increases. Thus, the leakage current of the first thin film transistor Ts1 is more than the leakage current of the second thin film transistor Ts2 that is not exposed to the ambient light.

The leakage current of the first thin film transistor Ts1 charges the storage capacitor Cst while the second thin film transistor Ts2 is turned off. As long as the second thin film transistor Ts2 is turned off, charges stored in the storage capacitor Cst are maintained.

When Vg signal is applied to the Vg signal line that is electronically connected to the gate electrode 202b of the second thin film transistor Ts2, the second thin film transistor Ts2 is turned on. Thus, charges stored in the storage capacitor flow through the second thin film transistor Ts2 and the readout line ROL to be transferred to the readout circuit part ROC.

Thus, the readout circuit part ROC measures the amount of current, obtains an intensity of the ambient light from the amount of current, and feedbacks a converted digital signal to the backlight that is disposed under the array substrate 200 to adjust a luminance of the backlight.

Hereinafter, a method of manufacturing the array substrate 200 of FIG. 7 will be explained referring to FIG. 9.

A first conductive layer comprises metal, for example, such as aluminum alloy, chromium (Cr), molybdenum (Mo), cupper (Cu) or alloy thereof, etc., is deposited on the array substrate 200 that includes a display region 250 and a peripheral region. The first conductive layer is patterned to form a first conductive pattern. The first conductive layer may be patterned via a photolithography method.

The first conductive pattern includes a gate line GL, a gate electrode of a thin film transistor that is disposed in the display region (not shown), and gate electrodes 202a and 202b of the first and second thin film transistors Ts1 and Ts2 of the light sensing part 260. The gate line is extended in a first direction. The gate electrode of the thin film transistor of the display region is diverged from the gate line GL.

Silicon nitride is deposited on the array substrate that has the first conductive pattern. Then, active layer that comprises amorphous silicon, and ohmic contact layer that comprises n+ amorphous silicon are deposited in sequence. The active layer and the ohmic contact layer may be formed by in-situ process in a chamber of PECVD apparatus. Then, the active layer and the ohmic contact layer are patterned, for example via photolithography, to form active patterns 205a and 205b that comprise amorphous silicon, and ohmic contact patterns 206 and 206b that comprise n+ amorphous silicon.

A second conductive layer that comprises aluminum neodymium (AlNd), chromium (Cr), molybdenum (Mo), alloy thereof, etc., is deposited and patterned to form a second conductive pattern.

The second conductive pattern includes a data line Vdata, a readout line ROL and a lower electrode of a storage capacitor Cst. The data line Vdata is extended in a second direction that is substantially perpendicular to the first direction. The readout line ROL is extended in the second direction, so that the readout line ROL and the data line are substantially in parallel with each other.

Additionally, the second conductive pattern includes source and drain electrodes (not shown) of a thin film transistor that is disposed in the display region, a drain electrode 208a of the first thin film transistor Ts1, and a source electrode 208c of the second thin film transistor Ts2. The source electrode of the thin film transistor in the display region is diverged from the data line Vdata. The drain electrode 208a of the first thin film transistor Ts1 is diverged from the data line Vdata of the peripheral region. The source electrode 208c of the second thin film transistor Ts2 is diverged from the readout line ROL.

Then, the ohmic contact patterns 206a and 206b that are exposed through between the drain and source electrodes 208a and 208b, and between the drain and source electrodes 208b and 208c, respectively are removed via a reactive ion etching method. Then, active patterns exposed between the drain and source electrodes 208a and 208b, and between the drain and source electrodes 208b and 208c, respectively operate as channels of the first and second thin film transistors Ts1 and Ts2 of the light sensing part.

When the thin film transistors are formed, an insulation layer 210 is formed. The insulation layer 210 may comprise silicon nitride. The insulation layer 210 operates also as a dielectronic layer of the storage capacitor Cst.

Additionally, a portion of the insulation layer 210 is removed, so that a contact hole (not shown) that exposes drain electrode of the thin film transistor in the display region is formed.

Then, a transparent conductive layer that comprises indium tin oxide (ITO) or indium zinc oxide (IZO), and a reflective layer that comprises chromium (Cr), Molybdenum (Mo), aluminum neodymium (AlNd), cupper (Cu), or a mixture thereof are deposited in sequence on the insulation layer 210 having the contact hole. The transparent conductive layer and the reflective layer are patterned to form a pixel electrode (not shown) of the pixel and an upper electrode 212 of the storage capacitor Cst of the light sensing part, such that the pixel electrode is electronically connected to the drain electrode of the thin film transistor that is disposed in the display region via the contact hole.

The pixel electrode includes a transparent electrode and a reflective electrode. The transparent and reflective electrodes define a transmission region and a reflective region respectively.

Then, silicon nitride is deposited on the array substrate 200 on which the pixel electrode and the upper electrode 212 of the storage capacitor Cst are formed to form protection layer 214. Additionally, a light blocking material is deposited on the array substrate 200, and patterned to form a light blocking layer 216. The light blocking layer 216 is disposed over the second thin film transistor Ts2 of the light sensing part 260. In the present embodiment, a transmissive and reflective type liquid crystal display apparatus is explained as an example. However, the second embodiment of the present invention is applicable to a transmissive type liquid crystal display apparatus.

As described above, according to the present embodiment, a light sensing part that senses an intensity of an ambient light is formed on an array substrate of a transmissive and reflective type liquid crystal display apparatus. The light sensing part senses the intensity of the ambient light, and the light sensing part outputs a signal according to the intensity of the ambient light. Then, a luminance of a backlight assembly disposed under the array substrate is adjusted according to the signal of the light sensing part. Thus, a luminance of the liquid crystal display apparatus is optimized.

EMBODIMENT 4

Figure 10:
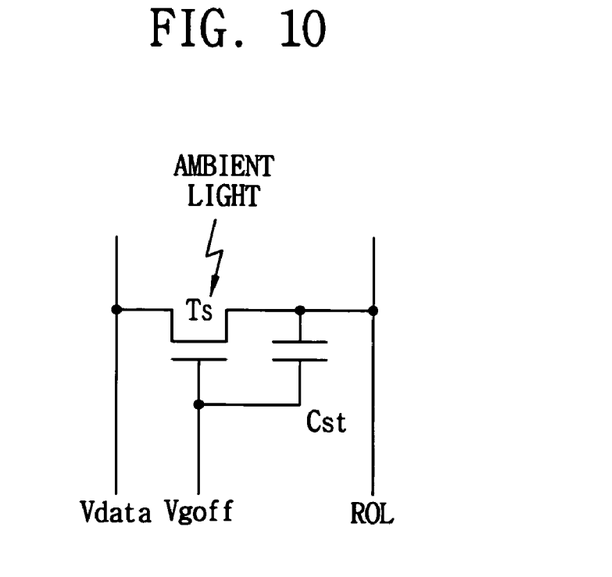
FIG. 10 is a circuit diagram showing a light sensing part of a transmissive and reflective type liquid crystal display apparatus according to a fourth exemplary embodiment of the present invention.

FIG. 10 is a circuit diagram showing a light sensing part of a transmissive and reflective type liquid crystal display apparatus according to a fourth exemplary embodiment of the present invention.

Referring to FIG. 10, a light sensing part of a transmissive and reflective type is liquid crystal display apparatus according to a fourth exemplary embodiment of the present invention includes an amorphous silicon thin film transistor that operates as a light sensing thin film transistor Ts and a storage capacitor Cst. A leakage current of the thin film transistor Ts is measured by direct use of the storage capacitor.

The light sensing thin film transistor Ts includes a gate electrode that is electronically connected to a Voff signal line, a drain electrode that is electronically connected to a data line Vdata, and a source electrode that is electronically connected to a lower electrode of the storage capacitor Cst and a readout line ROL.

When an ambient light arrives at the light sensing thin film transistor Ts, a leakage current increases in accordance with an intensity of the ambient light. Then, electronic charges are stored in the storage capacitor Cst due to the leakage current, and the electronic charges are transferred to a readout circuit part ROC.

Thus, the readout circuit ROC measures a magnitude of the leakage current, obtains an intensity of the ambient light, and feedbacks a converted digital signal to adjust a luminance of a backlight assembly. The light sensing part of the present embodiment may be used for a transmissive type liquid crystal display apparatus.

EMBODIMENT 5

Figure 11:
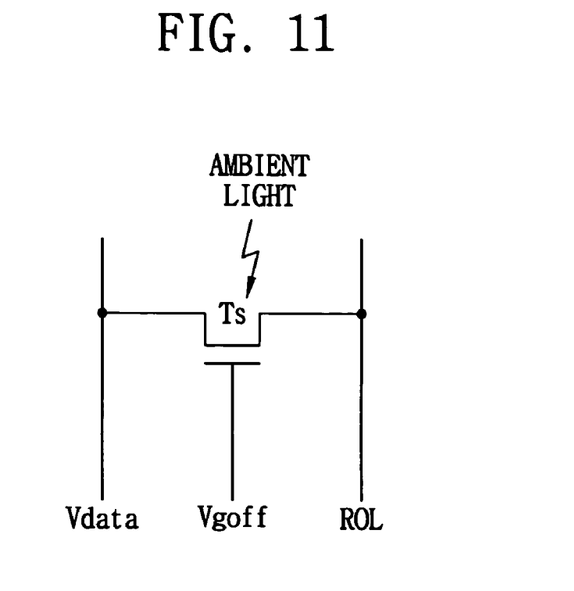
FIG. 11 is a circuit diagram showing a light sensing part of a transmissive and reflective type liquid crystal display apparatus according to a fifth exemplary embodiment of the present invention.

FIG. 11 is a circuit diagram showing a light sensing part of a transmissive and reflective type liquid crystal display apparatus according to a fifth exemplary embodiment of the present invention.

Referring to FIG. 11, a light sensing part of a transmissive and reflective type liquid crystal display apparatus senses an intensity of an ambient light by using one amorphous silicon thin film transistor.

When an ambient light arrives at a light sensing thin film transistor Ts, a leakage current flows through a channel of a light sensing thin film transistor Ts. The leakage current flows through the readout line to a readout circuit part ROC.

Then, the readout circuit part ROC measures a magnitude of the leakage current to obtain an intensity of the ambient light, and feedbacks a converted digital signal to adjust a luminance of a backlight assembly.

The light sensing part of the present embodiment may be used for a transmissive type liquid crystal display apparatus.

EMBODIMENT 6

Figure 12:
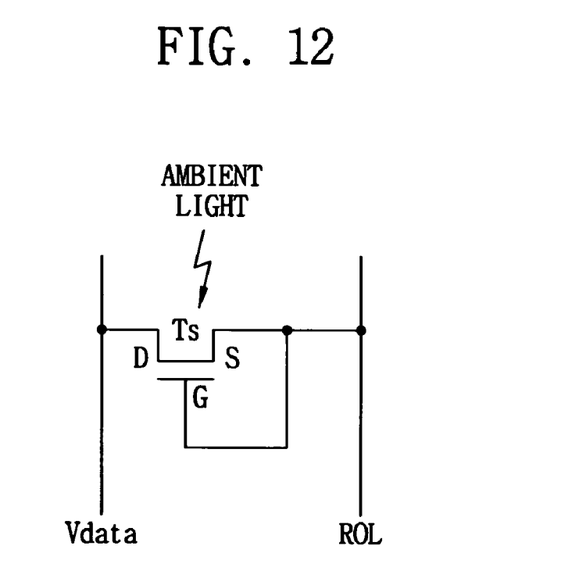
FIG. 12 is a circuit diagram showing a light sensing part of a transmissive and reflective type liquid crystal display apparatus according to a sixth exemplary embodiment of the present invention.
Figure 13:
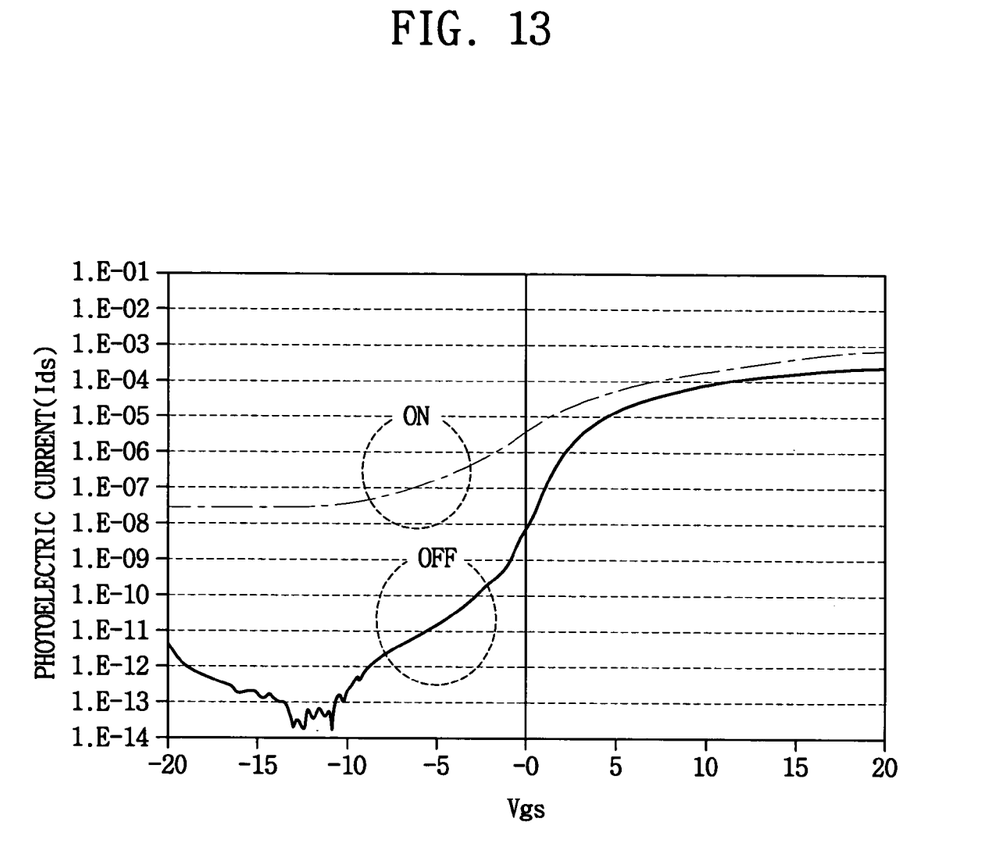
FIG. 13 is a graph showing leakage currents corresponding to a case of presence of an ambient light and a case of absence of an ambient light.

FIG. 12 is a circuit diagram showing a light sensing part of a transmissive and reflective type liquid crystal display apparatus according to a sixth exemplary embodiment of the present invention, and FIG. 13 is a graph showing leakage currents corresponding to a case of presence of an ambient light and a case of absence of an ambient light. In graph of FIG. 13, "OFF" corresponds to a leakage current without an ambient light, and "ON" corresponds to a leakage current with an ambient light incident on a light sensing thin film transistor Ts.

Referring to FIGS. 12 and 13, a light sensing part of a transmissive and reflective type liquid crystal display apparatus according to a sixth exemplary embodiment of the present invention includes an amorphous silicon thin film transistor corresponding to a light sensing thin film transistor Ts.

When a voltage of a gate electrode Vgs of the light sensing thin film transistor Ts is 0V, a leakage current OFF without an ambient light and a leakage current ON with an ambient light are measured to obtain a difference between the leakage current OFF and the leakage current ON.

Then, a difference between the leakage current OFF and the leakage current ON is fed back as a signal of adjusting a luminance of a backlight assembly.

The light sensing part may adopt a thin film diode or a PIN diode including p-type semiconducting layer, intrinsic semiconducting layer and n-type semiconducting layer.

According to present invention, the light sensing part that senses an intensity of an ambient light is formed on the array substrate, so that a luminance of the display apparatus may be adjusted in accordance with the intensity of the ambient light.

That is, in case of the AMOELD, when a luminance of a circumference light is low, a luminance of the organic electroluminescent device EL is lowered so as to enhance a lifespan, and when the luminance of the circumference light is high, the luminance of the organic electroluminescent device EL is raised, so as to enhance visibility.

In case of the transmissive and reflective type liquid crystal display apparatus, a luminance of a backlight assembly is adjusted in accordance with the intensity sensed by the light sensing part.

Having described the exemplary embodiments of the present invention and its advantages, it is noted that various changes, substitutions and alterations can be made herein without departing from the spirit and scope of the invention as defined by appended claims.

What is claimed is:

1. An electronic display apparatus comprising:
   a substrate including a display region and a peripheral region that is adjacent the display region, the substrate including a plurality of gate lines extended in a first direction and a plurality of data lines extended in a second direction that is substantially perpendicular to the first direction;
   a plurality pixels formed in the display region to display an image, the pixels being defined by each of the data lines and each of the gate lines;
   at least one light sensing part formed in the peripheral region and senses an intensity of an ambient light; and
   a readout line formed in the peripheral region and electronically connected to the light sensing parts,
   wherein the light sensing part is formed at a crossing point of the readout line and an actual or imaginary extension of a corresponding gate line.

2. The electronic display apparatus of claim 1, wherein a plurality of the light sensing parts is arranged in one-dimensional array.

3. The electronic display apparatus of claim 1, wherein a plurality of the light sensing parts is arranged in two-dimensional array.

4. The electronic display apparatus of claim 1, wherein the light sensing part comprises:

a thin film transistor that generates a photocurrent of which magnitude is determined in accordance with the intensity of the ambient light; the thin film transistor includes a drain electrode electrically connected to a power supply line Vdd, and gate and source electrodes electrically connected to each other via the readout line.

5. The electronic display apparatus of claim 1, further comprising:
a driving circuit part formed in the peripheral region, the driving circuit part being electronically connected to the gate and data lines to drive the pixels; and
a readout circuit part formed in the peripheral region, the readout circuit part reading out the intensity of an ambient light that is sensed by the light sensing parts.

6. The electronic display apparatus of claim 1, wherein each of the pixels includes an amorphous silicon thin film transistor as a switching device, and the light sensing part includes at least one of amorphous silicon thin film transistors.

7. The electronic display apparatus of claim 1, wherein the light sensing part comprises:
a first thin film transistor that generates a photocurrent of which magnitude is determined in accordance with the intensity of the ambient light;
a storage capacitor that stores electronic charges by the photoelectronic current generated from the first thin film transistor; and
a second thin film transistor that outputs the electronic charges stored in the storage capacitor.

8. The electronic display apparatus of claim 7, further comprising a light blocking layer that prevents the ambient light from reaching the second thin film transistor.

9. The electronic display apparatus of claim 1, wherein the light sensing part includes a thin film transistor and a storage capacitor.

10. The electronic display apparatus of claim 1, wherein the light sensing part includes a thin film transistor.

11. The electronic display apparatus of claim 1, wherein the light sensing part includes a thin film diode.

12. The electronic display apparatus of claim 1, wherein the light sensing part includes a PTN diode having a p-type semiconducting layer, an intrinsic semiconducting layer and an n-type semiconducting layer.

13. The electronic display apparatus of claim 1, wherein the light sensing part comprises:
a thin film transistor that generates a leakage current of which magnitude is determined in accordance with the intensity of the ambient light; and p1 a storage capacitor that stores electronic charges due to a leakage current generated from the thin film transistor,
wherein the thin film transistor includes a gate electrode electronically connected to a Voff signal line, a drain electrode electronically connected to a data line Vdata, and a source electrode electronically connected to a lower electrode of the storage capacitor and the readout line.

14. The electronic display apparatus of claim 1, wherein the light sensing part comprises:
a thin film transistor that generates a leakage current of which magnitude is determined in accordance with the intensity of the ambient light; the thin film transistor includes a gate electrode electronically connected to a Voff signal line, a drain electrode electronically connected to a data line Vdata, and a source electrode electrically connected to the readout line.

15. The electronic display apparatus of claim 1, wherein the light sensing part comprises:

a thin film transistor that generates a leakage current of which magnitude is determined in accordance with the intensity of the ambient light; the thin film transistor includes a drain electrode electronically connected to a data line Vdata, and gate and source electrodes of the light sensing thin film transistor are electronically connected to each other and the readout line.

16. The electronic display apparatus of claim 1, wherein the readout line extends substantially parallel and aligned with the plurality of data lines.

17. The electronic display apparatus of claim 7,
wherein the first thin film transistor includes a drain electrode electrically connected to a corresponding data line, a gate electrode electrically connected to one terminal of the storage electrode, a source electrode electrically connected to the other terminal of the storage capacitor; and
wherein the second thin film transistor includes a drain electrode electrically connected to the source electrode of the first thin film transistor and the other terminal of the storage electrode, a source electrode electrically connected to the readout line and a gate electrode electrically connected to a Vg signal.

18. The electronic display apparatus of claim 7, wherein the Vg signal is via a gate line or a separately formed Vg signal line.

19. An organic electroluminescent display apparatus comprising:
a substrate including a display region and a peripheral region that is adjacent the display region;
a plurality of pixels that includes a gate line extended in a first direction, a data line extended in a second direction that is substantially perpendicular to the first direction, a switching device that is electronically connected to the gate and data lines, a first electrode that is electronically connected to the switching device, an electroluminescent layer disposed over the first electrode, and a second electrode formed on the electroluminescent layer;
at least one light sensing part that is formed in the peripheral region and senses an intensity of an ambient light; and
a readout line formed in the peripheral region and electronically connected to the light sensing parts,
wherein the at least one light sensing part is formed at a crossing point of the readout line and an actual or imaginary extension of a corresponding gate line.

20. The organic electroluminescent display apparatus of claim 19, wherein the at least one light sensing part includes a plurality of the light sensing parts arranged in a one-dimensional array.

21. The organic electroluminescent display apparatus of claim 19, wherein each of the at least one light sensing part includes an inverted staggered type amorphous silicon thin film transistor.

22. The organic electroluminescent display apparatus of claim 21, wherein each of the light sensing parts comprises:
a light sensing thin film transistor which outputs an electronic signal when the light sensing thin film transistor is exposed to the ambient light;
a power supply line electronically connected to a drain electrode of the light sensing thin film transistor; and
the readout line electronically connected to a source electrode of the light sensing thin film transistor and transfers the electronic signal outputted from the light sensing thin film transistor to a readout circuit part.

23. The organic electroluminescent display apparatus of claim 22, wherein the gate and source electrodes of the light sensing thin film transistor are electronically connected to each other.

24. The organic electroluminescent display apparatus of claim 19, further comprising:
   a driving circuit part formed in the display region, the driving circuit that is electronically connected to the gate line and data line to drive the pixel; and
   a readout part formed in the display region, the readout part reading out intensity of the ambient light sensed by the light sensing part.

25. The organic electroluminescent display apparatus of claim 19, wherein each of the pixels further includes at least one driving device and at least one capacitor.

26. The organic electroluminescent display apparatus of claim 25, wherein the switching device and driving device include an inverted staggered type amorphous silicon thin film transistor.

27. The organic electroluminescent display apparatus of claim 19, wherein the first electrode is opaque and the second electrode is transparent.

28. The organic electroluminescent display apparatus of claim 19, wherein the first electrode is transparent and the second electrode is opaque.

29. The electronic display apparatus of claim 19, wherein the readout line extends substantially parallel and aligned with the plurality of data lines.

* * * * *